United States Patent
Cheng et al.

(10) Patent No.: US 10,522,661 B2
(45) Date of Patent: *Dec. 31, 2019

(54) INTEGRATED STRAINED STACKED NANOSHEET FET

(71) Applicant: INTERNATIONAL BUSINESS MACHINES CORPORATION, Armonk, NY (US)

(72) Inventors: Kangguo Cheng, Schenectady, NY (US); Ramachandra Divakaruni, Ossining, NY (US); Juntao Li, Cohoes, NY (US); Xin Miao, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/926,151

(22) Filed: Mar. 20, 2018

(65) Prior Publication Data
US 2018/0212035 A1  Jul. 26, 2018

Related U.S. Application Data

(63) Continuation of application No. 15/476,164, filed on Mar. 31, 2017, now Pat. No. 9,997,618, which is a
(Continued)

(51) Int. Cl.
*H01L 29/423* (2006.01)
*H01L 29/66* (2006.01)
(Continued)

(52) U.S. Cl.
CPC ...... *H01L 29/6681* (2013.01); *H01L 21/0217* (2013.01); *H01L 21/02271* (2013.01);
(Continued)

(58) Field of Classification Search
CPC ............ H01L 29/7842; H01L 29/0673; H01L 29/66545; H01L 21/845; H01L 21/823821;
(Continued)

(56) References Cited

U.S. PATENT DOCUMENTS 6,635,909 B2   10/2003   Clark et al.
6,849,884 B2    2/2005   Clark et al.
(Continued)

OTHER PUBLICATIONS

List of IBM Patents or Patent Applications Treated as Related dated Mar. 20, 2018, 2 pages.
(Continued)

*Primary Examiner* — Jarrett J Stark
(74) *Attorney, Agent, or Firm* — Tutunjian & Bitetto, P.C.; Vazken Alexanian

(57) ABSTRACT

Methods of forming a semiconductor device include forming stress liners in contact with both ends of a fin of alternating channel material and sacrificial material layers. The stress liners exert a stress on the fin. The sacrificial material is etched away from the fin, such that the layers of the channel material are suspended between the stress liners. A gate stack on the suspended layers of channel material.

17 Claims, 7 Drawing Sheets

Related U.S. Application Data continuation of application No. 15/148,536, filed on May 6, 2016, now Pat. No. 9,735,269.

(51) Int. Cl.

| | | |
|---|---|---|
| *H01L 29/78* | (2006.01) | |
| *H01L 29/06* | (2006.01) | |
| *H01L 21/8238* | (2006.01) | |
| *H01L 21/84* | (2006.01) | |
| *H01L 21/8234* | (2006.01) | |
| *H01L 29/08* | (2006.01) | |
| *H01L 29/10* | (2006.01) | |
| *H01L 21/02* | (2006.01) | |
| *H01L 29/786* | (2006.01) | |
| *H01L 27/12* | (2006.01) | |

(52) U.S. Cl.
CPC ........ *H01L 21/823431* (2013.01); *H01L 21/823821* (2013.01); *H01L 21/84* (2013.01); *H01L 21/845* (2013.01); *H01L 27/1203* (2013.01); *H01L 29/0665* (2013.01); *H01L 29/0673* (2013.01); *H01L 29/0847* (2013.01); *H01L 29/1033* (2013.01); *H01L 29/42392* (2013.01); *H01L 29/6653* (2013.01); *H01L 29/66439* (2013.01); *H01L 29/66553* (2013.01); *H01L 29/7842* (2013.01); *H01L 29/7843* (2013.01); *H01L 29/7853* (2013.01); *H01L 29/78696* (2013.01); *H01L 21/02274* (2013.01); *H01L 29/66545* (2013.01)

(58) Field of Classification Search
CPC ... H01L 21/823431; H01L 2924/13089; H01L 2924/13088; H01L 2924/13086; H01L 2924/13061; H01L 2924/10325; H01L 51/057; H01L 29/775; H01L 29/66469; H01L 29/66439; H01L 29/36–365; H01L 29/22–2206; H01L 29/18–185; H01L 29/16–1608; H01L 29/04–045; H01L 2924/13067; H01L 2029/7857–7858; H01L 29/785–7856; H01L 29/66795–66818; H01L 29/41791; H01L 27/1211; H01L 27/10879; H01L 27/10826; H01L 27/0924; H01L 27/0886
See application file for complete search history.

(56) References Cited

U.S. PATENT DOCUMENTS

| | | | |
|---|---|---|---|
| 7,524,740 | B1 | 4/2009 | Liu et al. |
| 7,705,345 | B2 | 4/2010 | Bedell et al. |
| 7,902,541 | B2 | 3/2011 | Sekaric et al. |
| 7,989,233 | B2 | 8/2011 | Sekaric et al. |
| 8,129,290 | B2 | 3/2012 | Balseanu et al. |
| 8,247,275 | B2 | 8/2012 | Hoentschel et al. |
| 8,492,208 | B1 * | 7/2013 | Cohen ............... H01L 29/66439 257/288 |
| 8,716,695 | B2 | 5/2014 | Cohen et al. |
| 8,962,435 | B2 | 2/2015 | Maeda et al. |
| 9,224,810 | B2 * | 12/2015 | Kim ..................... H01L 27/092 |
| 9,240,481 | B2 | 1/2016 | Maeda et al. |
| 9,252,275 | B2 | 2/2016 | Rachmady et al. |
| 9,484,267 | B1 * | 11/2016 | Cheng ............. H01L 21/823821 |
| 9,484,405 | B1 * | 11/2016 | Balakrishnan ...... H01L 29/0673 |
| 9,484,406 | B1 * | 11/2016 | Sun ........................ H01L 29/413 |
| 2003/0181005 | A1 | 9/2003 | Hachimine et al. |
| 2010/0295021 | A1 * | 11/2010 | Chang ................. H01L 27/1203 257/24 |
| 2010/0297816 | A1 * | 11/2010 | Bedell .................... B82Y 10/00 438/151 |
| 2011/0117679 | A1 | 5/2011 | Lee et al. |
| 2011/0233522 | A1 * | 9/2011 | Cohen ................. H01L 29/0673 257/24 |
| 2012/0138886 | A1 * | 6/2012 | Kuhn ..................... B82Y 10/00 257/9 |
| 2012/0146053 | A1 * | 6/2012 | Saitoh ............... H01L 29/66795 257/77 |
| 2013/0153993 | A1 * | 6/2013 | Chang ..................... B82Y 10/00 257/330 |
| 2013/0234215 | A1 * | 9/2013 | Okano ............. H01L 29/42392 257/255 |
| 2014/0175379 | A1 * | 6/2014 | Chu-Kung ............ H01L 29/267 257/20 |
| 2015/0243733 | A1 * | 8/2015 | Yang ................... H01L 29/0673 257/401 |
| 2015/0263088 | A1 * | 9/2015 | Cheng ................. H01L 29/0673 257/20 |

OTHER PUBLICATIONS

M. Belyansky et al., Methods of producing plasma enhanced chemical vapor deposition silicon nitride thin films with high compressive and tensile stress, J. Vac. Sci. Technol., May/Jun. 2008.
Office Action for U.S. Appl. No. 15/356,979 dated Jul. 17, 2017 (19 pages).

* cited by examiner

INTEGRATED STRAINED STACKED NANOSHEET FET

BACKGROUND

Technical Field

The present invention generally relates to semiconductor devices and, more particularly, to strained channel field effect transistors.

Description of the Related Art

As semiconductor fabrication processes produce increasingly small features, nanowires and nanosheets are being used to further the scaling of complementary metal-oxide semiconductor (CMOS) devices, and field effect transistors (FETs) in particular.

Strain engineering is used in CMOS fabrication to boost device performance. Putting a compressive on a p-type CMOS transistor or a tensile strain on an n-type CMOS transistor can enhance electron (or hole) mobility in the transistor's channel and thereby improve conductivity of the device. Various techniques may be used to induce strain in a semiconductor structure.

However, when, for example, a strained semiconductor fin is cut to length, the induced strain can relax at the fin ends. The loss of strain at fin ends can cause device degradation and variation.

SUMMARY

A method for forming a semiconductor device includes forming stress liners in contact with both ends of a fin of alternating channel material and sacrificial material layers. The stress liners exert a stress on the fin. The sacrificial material is etched away from the fin, such that the layers of the channel material are suspended between the stress liners. A gate stack on the suspended layers of channel material.

A method of forming a semiconductor device includes forming a dielectric fill around a fin of alternating channel material and sacrificial material layers. Stress liners are formed in contact with both ends of the fin after forming the dielectric fill. The stress liners exert a stress on the fin. The sacrificial material is etched away from the fin, such that the layers of the channel material are suspended between the stress liners. A gate stack is formed on the suspended layers of channel material.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide strain at the ends of nanosheets and nanowires by providing a stress liner at opposite ends of the devices. For p-type field effect transistors (pFETs), a compressive stress liner is used, while for n-type field effect transistors (nFETs), a tensile stress liner is used. The liner is deposited before the nanowires or nanosheets are freed from their fins.

Figure 1:
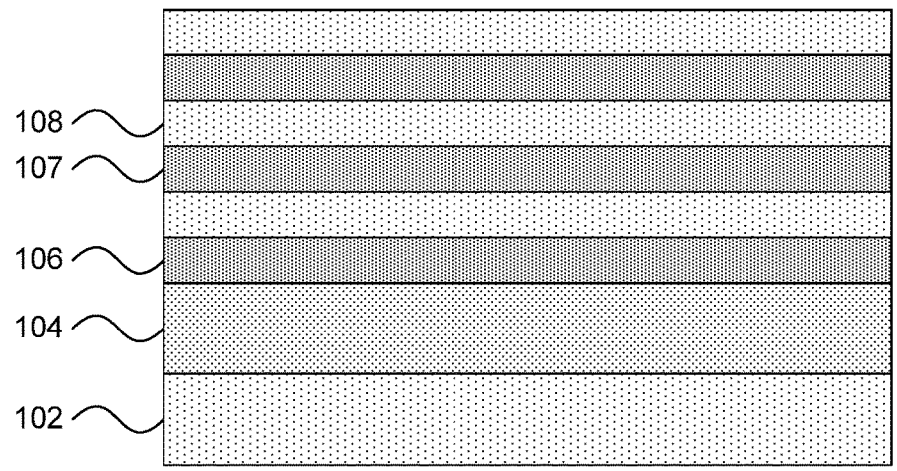
FIG. 1 is a cross-sectional diagram of a step in forming an integrated, strained, stacked nanowire field effect transistor (FET) in accordance with the present principles.

Referring now to FIG. 1, a step in fabricating an end-stressed transistor device is shown. The figure shows a semiconductor-on-insulator substrate with a first semiconductor layer 106 on an insulator layer 104 and a bulk substrate 102 below them. The bulk semiconductor substrate 102 may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide.

It is specifically contemplated that the insulator layer 104 can be formed from silicon dioxide, but it should be understood that any appropriate dielectric material may be used instead. A dielectric material may be low-k (i.e., having a dielectric constant k that is lower than that of silicon dioxide) or high-k (i.e., having a dielectric constant k that is higher than that of silicon dioxide. Exemplary alternative low-k dielectrics include SiCOH, carbon-doped oxides, and undoped silicon glass. Exemplary alternative high-k dielectrics include hafnium oxides, hafnium silicates, titanium oxides, barium-strontium-titantates, and lead-zirconate-titanates.

The first semiconductor layer 106 is the first layer in a stack of sheets of alternating materials. The stack includes first semiconductor layers 107 and second semiconductor layers 108. Although it is specifically contemplated that the first semiconductor layers 107 may be formed from silicon germanium and that the second semiconductor layers 108 may be formed from silicon, it should be understood that any appropriate materials may be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating layers 107/108 can be deposited by any appropriate mechanism. It is specifically contemplated that the layers may be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
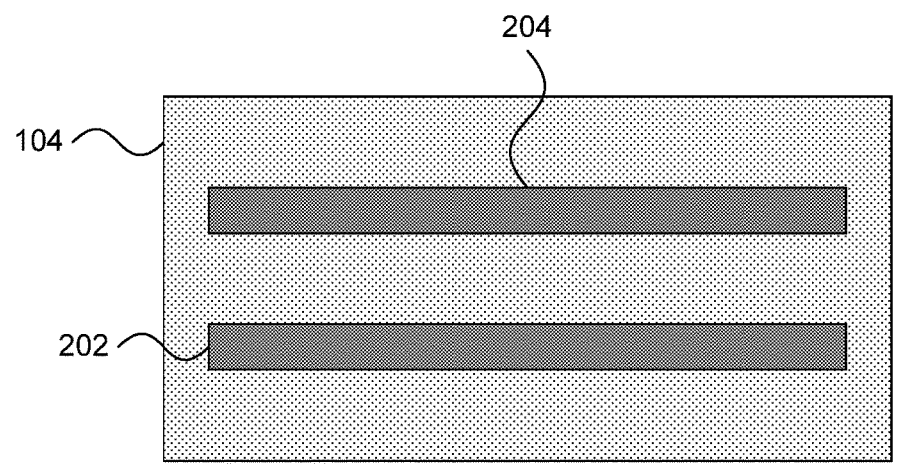
FIG. 2 is a top-down diagram of a step in forming an integrated, strained, stacked nanowire FET in accordance with the present principles.

Referring now to FIG. 2, a top-down view of a step in fabricating an end-stressed transistor device is shown. A hardmask 202 is deposited on the uppermost layer of second semiconductor material 108. The hardmask 202 is used to define fin regions, with material outside that covered by the hardmask 202 being etched away to expose the underling insulator layer 104, producing fins 204. It is specifically contemplated that this etch may be performed as part of a shallow trench isolation (STI) process, but it should be understood that other forms of anisotropic etching may be employed instead.

STI regions are formed by etching a trench in the substrate utilizing a conventional dry etching process such as reactive-ion etching (RIE) or plasma etching. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, fin structures 204 can be formed by spacer imaging transfer processes.

While it is specifically contemplated that the hardmask 202 may be formed from silicon nitride, it should be understood that alternative hardmask materials may include silicon oxides, silicon oxynitrides, silicon carbides, silicon carbonitrides, etc. Spin-on dielectrics may also be utilized as a hardmask material including, but not limited to: silsequioxanes, siloxanes, and boron phosphate silicate glass (BPSG). The hardmask 202 may be patterned using photolithographic processes, where the hardmask 202 may be produced by applying a photoresist layer to the substrate 12 surface, exposing the photoresist layer to a pattern of radiation, and then developing the pattern into the photoresist layer utilizing conventional resist developer.

It should be noted that the widths of the hardmasks 202 define the width of fins 204. In particular, controlling the widths of the hardmasks 202 determines whether the fins 204 form nanowires or nanosheets. It should be understood that nanowires have a width-to-thickness ratio that is about 2:1 or less, while nanosheets have a width-to-thickness ratio that is about 2:1 or greater. Nanowires will be shown and discussed herein, but the present principles and processes apply with equal effect to nanosheets.

Figure 3:
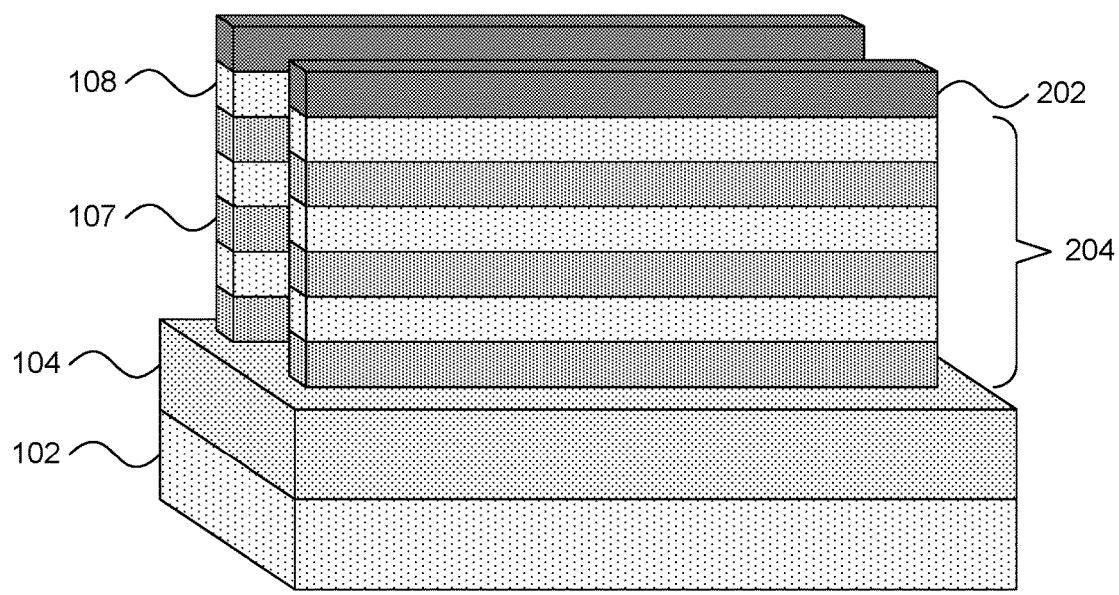
FIG. 3 is a perspective diagram of a step in forming an integrated, strained, stacked nanowire FET in accordance with the present principles.

Referring now to FIG. 3, a step in fabricating an end-stressed transistor device is shown. This figure shows a perspective view that illustrates the spatial relationship between the fins 204 and also distinguishes the fins 204 from the hardmasks 202.

Figure 4:
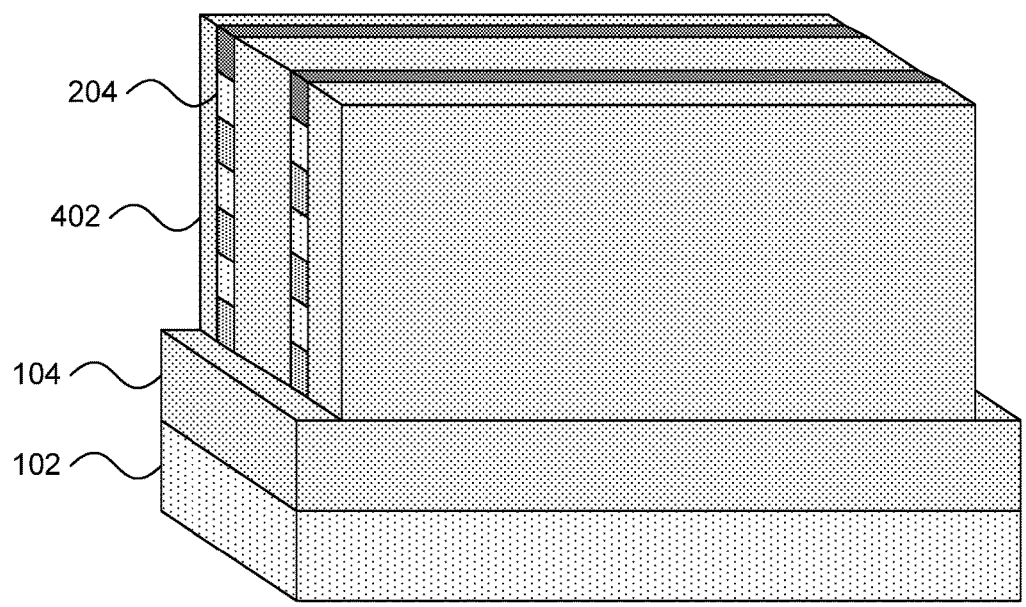
FIG. 4 is a perspective diagram of a step in forming an integrated, strained, stacked nanowire FET in accordance with the present principles.

Referring now to FIG. 4, a step in fabricating an end-stressed transistor device is shown. A dielectric material is filled in around the fins 204 to a height that exceeds a height of the hardmask 202. The dielectric material may then be polished down using, e.g., chemical mechanical planarization (CMP) down to the height of the hardmask 202 to form dielectric fill 402. The dielectric fill 402 may be formed from any appropriate dielectric, with oxides such as silicon dioxide being specifically contemplated.

CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Figure 5:
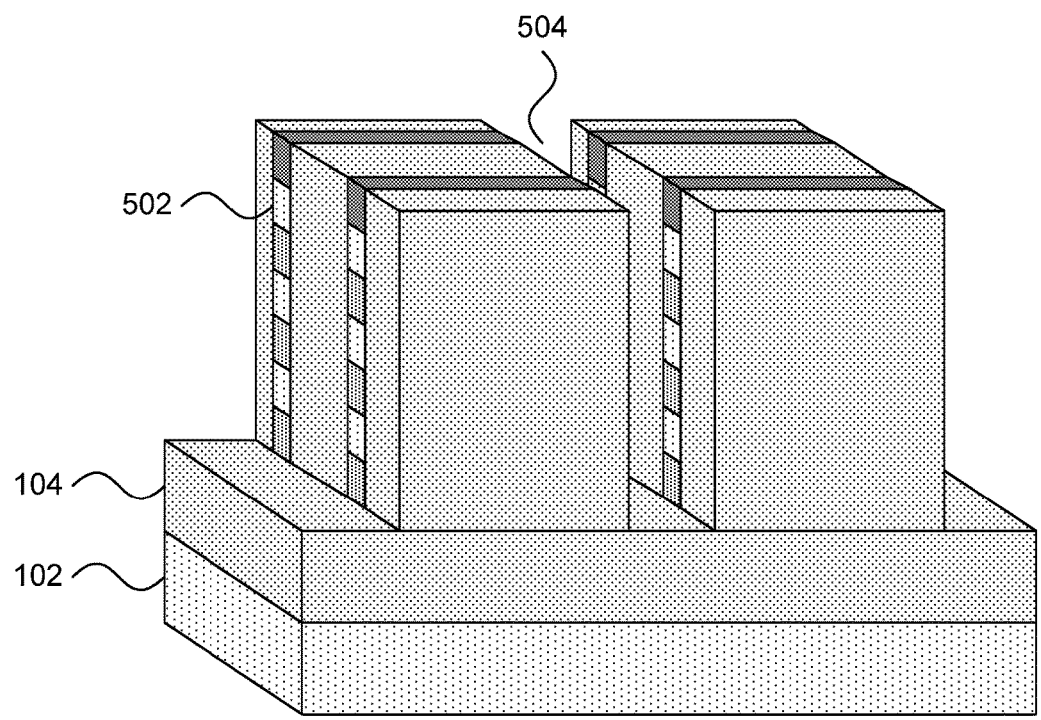
FIG. 5 is a perspective diagram of a step in forming an integrated, strained, stacked nanowire FET in accordance with the present principles.

Referring now to FIG. 5, a step in fabricating an end-stressed transistor device is shown. The fins 204 are cut to length according to design requirements, forming sets of fins 502. The cuts form gaps 504. The fins 204 may be cut using any appropriate anisotropic etch including, for example, RIE.

Figure 6:
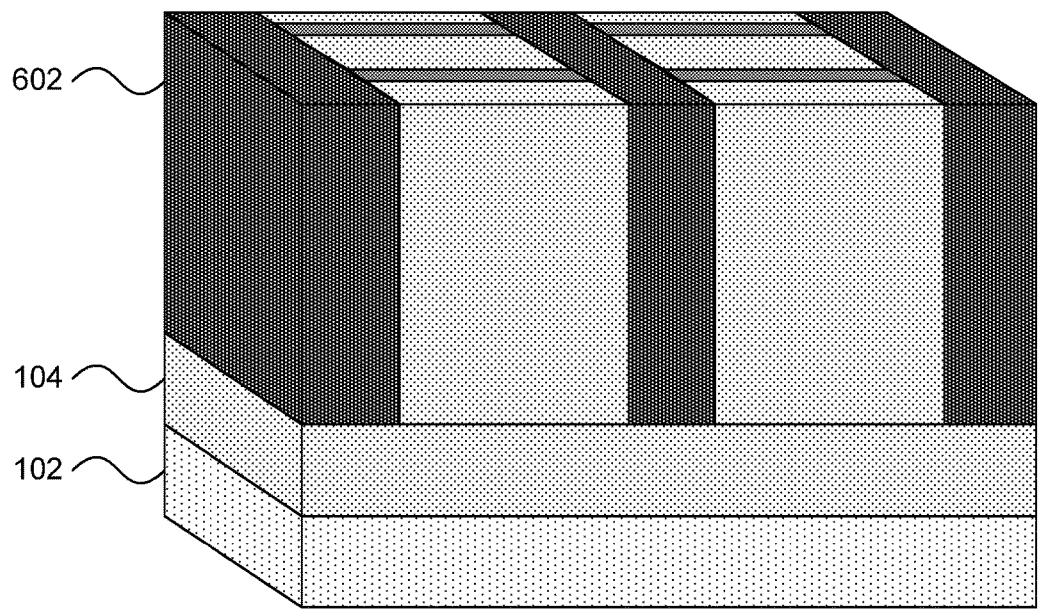
FIG. 6 is a perspective diagram of a step in forming an integrated, strained, stacked nanowire FET in accordance with the present principles.

Referring now to FIG. 6, a step in fabricating an end-stressed transistor device is shown. A stress liner 602 is deposited to fill the gaps 504 at the ends of the fins 502. The stress liner material is filled to a height equal to or greater than the height of the hardmasks 202 and subsequently polished down to the height of the hardmasks 202 using, e.g., CMP.

It should be noted that the stress liner 602 may be formed from a material that induces either compressive or tensile stress. A tensile stress inducing material may be a dielectric that generates a tensile stress on adjacent structures. In one specific example, a tensile stress inducing stress liner 602 may be formed from a tensile silicon nitride and may be formed using, e.g., PECVD. The PECVD process can provide nitride stress-inducing layers having an intrinsic tensile strain. The stress state of the nitride stress including liners deposited by PECVD can be controlled by changing the deposition conditions to alter the reaction rate within the deposition chamber. More specifically, the stress state of the deposited nitride strain inducing liner may be set by changing the deposition conditions such as: gas flow rate, pressure, radio frequency power, and electrode gap.

In another example, rapid thermal chemical vapor deposition (RTCVD) can provide nitride tensile strain inducing liners 602 having an internal tensile strain. The magnitude of the internal tensile strain produced within the nitride tensile strain inducing liner 602 deposited by RTCVD can be controlled by changing the deposition conditions. More specifically, the magnitude of the tensile strain within the nitride tensile strain inducing liner 602 may be set by changing deposition conditions such as: precursor composition, precursor flow rate, and temperature.

Alternative tensile stress inducing materials may include, for example, aluminum oxides, hafnium oxides, zirconium oxides, hafnium silicon oxides, or any combination thereof.

A tensile stress inducing material may be a dielectric that generates a tensile stress on adjacent structures. It is specifically contemplated that a compressive nitride may be used, but it should be understood that alternative compressive stress inducing materials may include amorphous carbon or a compressive oxide. A compressive strain inducing liner may be formed, for example, using PECVD or high density plasma chemical vapor deposition (HDPCVD). In one specific embodiment, PECVD can provide nitride strain inducing liners having a compressive internal strain. The stress state of the deposited nitride strain inducing liner may be set by changing the deposition conditions to alter the reaction rate within the deposition chamber, in which the deposition conditions include gas flow rate, pressure, radio frequency power, and electrode gap.

A silicon nitride stressed material having higher compressive stress values can be obtained by increasing radio frequency (RF) energy bombardment to achieve higher film density by having more Si—N bonds in the deposited material and reducing the density of Si—H and N—H bonds. Higher deposition temperatures and RF power improve the compressive stress levels of the deposited film. In addition, higher compressive stresses levels may be obtained in the deposited material at higher kinetic energy levels of plasma species. Bombardment of energetic plasma species, such as plasma ions and neutrals, generates compressive stresses in the deposited material because film density increases.

Figure 7:
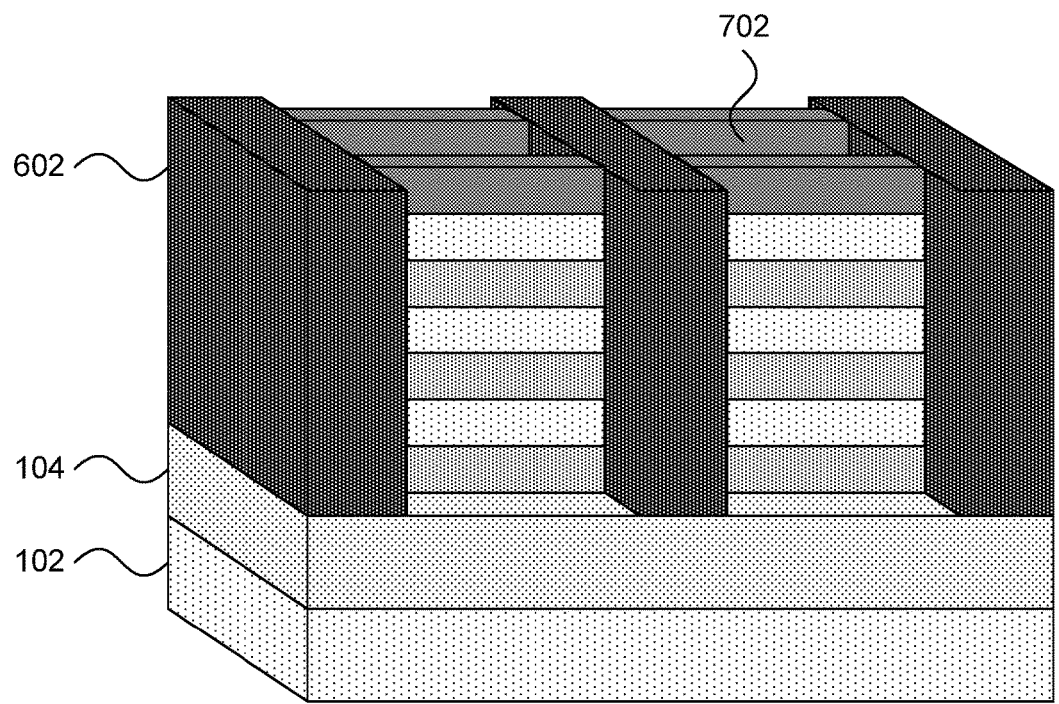
FIG. 7 is a perspective diagram of a step in forming an integrated, strained, stacked nanowire FET in accordance with the present principles.

Referring now to FIG. 7, a step in fabricating an end-stressed transistor device is shown. The dielectric fill 402 is etched away using any appropriate etching process. It is specifically contemplated that an isotropic wet etch may be used to selectively remove the dielectric material, exposing gaps 702 between the fins 502.

Figure 8:
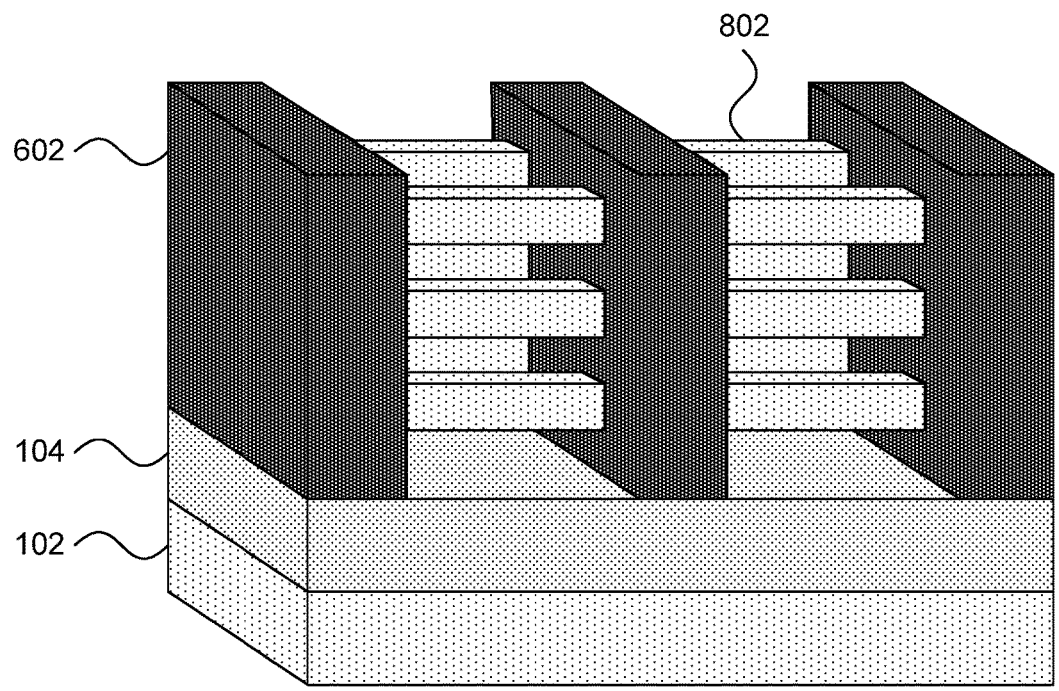
FIG. 8 is a perspective diagram of a step in forming an integrated, strained, stacked nanowire FET in accordance with the present principles.

Referring now to FIG. 8, a step in fabricating an end-stressed transistor device is shown. The hardmask 202 is removed and the layers of first semiconductor material 107 in the fins 502 are selectively etched away, leaving nanowires 802 of second semiconductor material 108 suspended from the stress liners 602. As noted above, nanosheets may be used instead of, or in addition to, nanowires 802.

Figure 9:
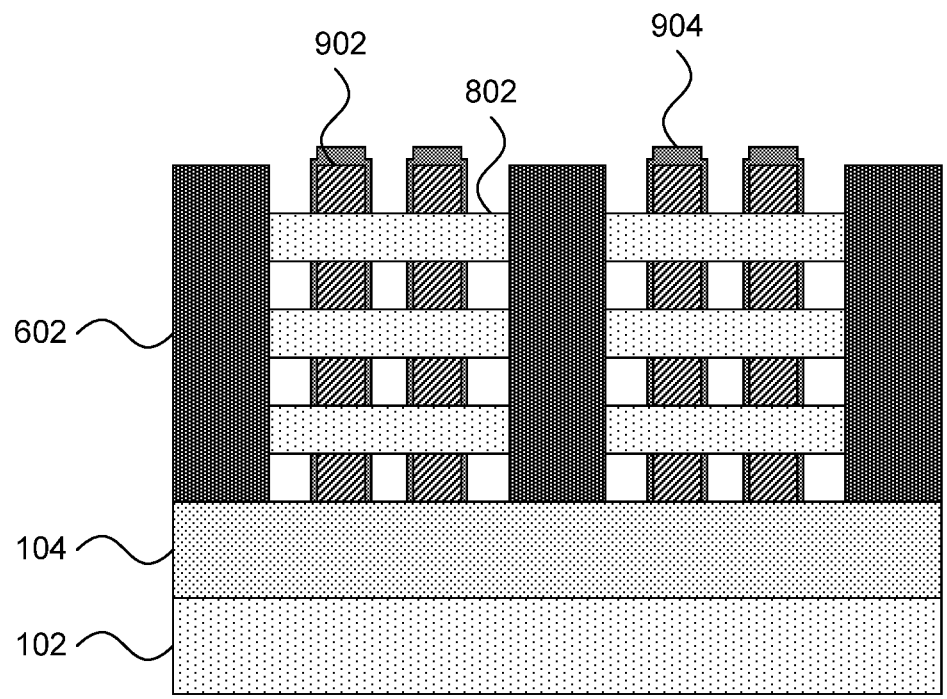
FIG. 9 is a cross-sectional diagram of a step in forming an integrated, strained, stacked nanowire FET in accordance with the present principles.

Referring now to FIG. 9, a step in fabricating an end-stressed transistor device is shown. The figure shows a cross-sectional view that is cut along a plane in the middle of a set of nanowires 802. Dummy gates 902 are deposited over and around the nanowires 802. It should be understood that final gates may be formed at this stage instead of dummy gates 902, but the present embodiments focus on a replacement gate process. The dummy gates 902 may be formed from any appropriate material including, e.g., polymorphous or amorphous silicon. The dummy gates 902 may be formed by, e.g., depositing dummy gate material conformally over all surfaces, including the surfaces of the channels 802, using any appropriate process, such as CVD, and anisotropically etching away material outside gate regions using, e.g., RIE. A liner 904 is formed over the dummy gates 902 and may be formed from silicon nitride or any other appropriate dielectric material.

Figure 10:
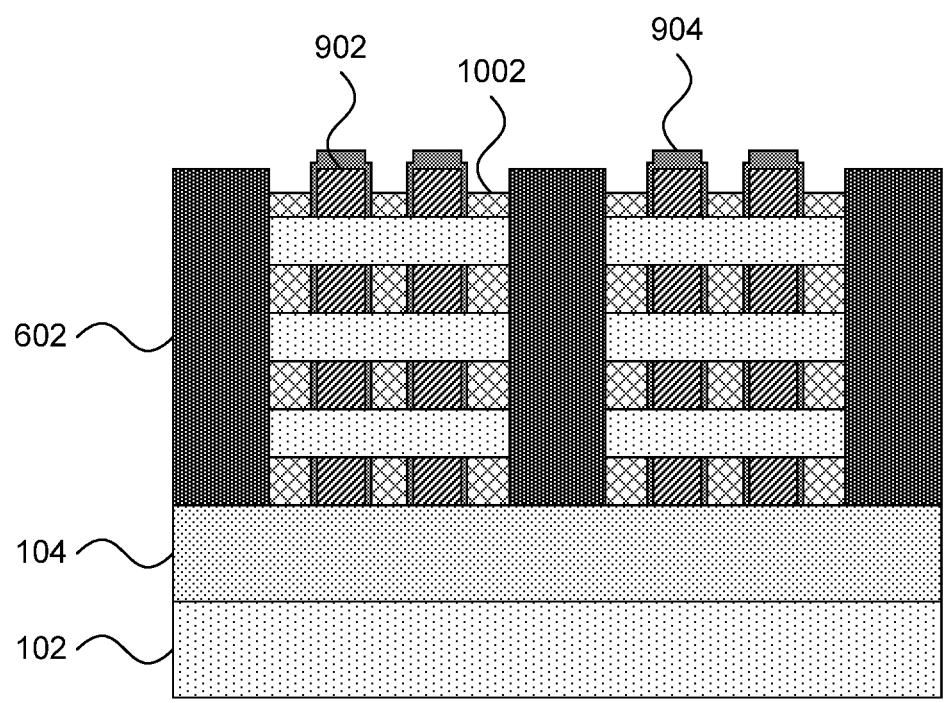
FIG. 10 is a cross-sectional diagram of a step in forming an integrated, strained, stacked nanowire FET in accordance with the present principles.

Referring now to FIG. 10, a step in fabricating an end-stressed transistor device is shown. Source/drain regions 1002 are deposited between the dummy gates 902 and around the nanowires 802. The source/drain regions 1002 may be formed from the same semiconductor material as the nanowires 802 (e.g., the second semiconductor material 108) or may be formed from a different material. It is specifically contemplated that the source/drain regions 1002 may be epitaxially grown, but it should be understood that any appropriate deposition method may be used instead. The source/drain regions 1002 may be made conductive through doping or silicidation.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium. As used herein, "n-type" refers to the addition of impurities that contributes free electrons to an intrinsic semiconductor In a silicon containing substrate examples of n-type dopants, i.e., impurities, include but are not limited to antimony, arsenic and phosphorous. For doped source/drain regions, an dopant appropriate to the device type is selected and either implanted into source/drain regions 1002 or added in situ during formation.

Alternatively, silicide formation involves depositing a refractory metal such as nickel or titanium onto the surface of the source/drain regions 1002. Following deposition, the structure is then subjected to an annealing step using conventional processes such as, but not limited to, rapid thermal annealing. During thermal annealing, the deposited metal reacts with the semiconductor, forming a metal silicide.

Figure 11:
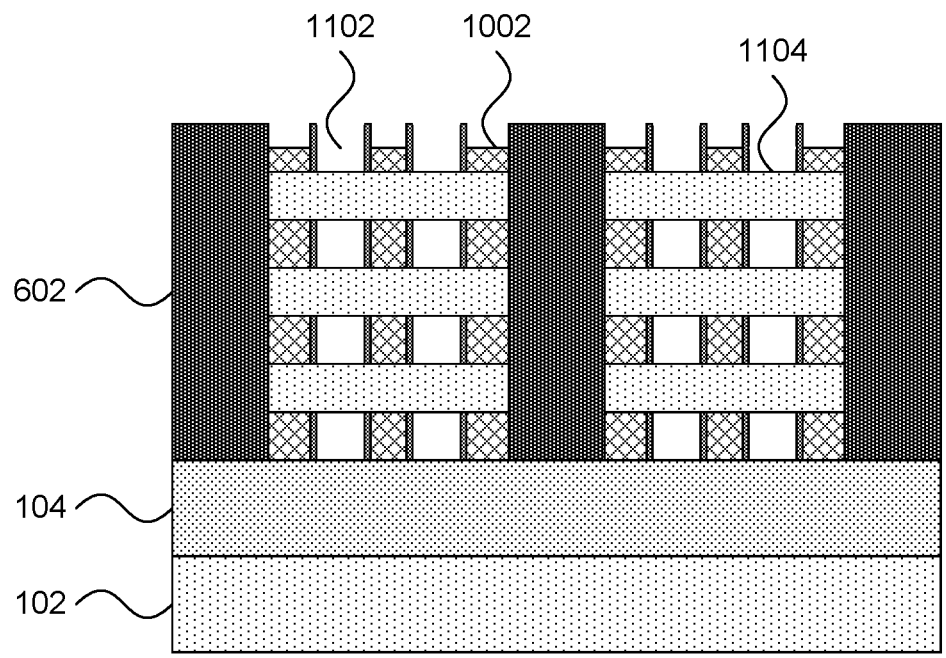
FIG. 11 is a cross-sectional diagram of a step in forming an integrated, strained, stacked nanowire FET in accordance with the present principles.

Referring now to FIG. 11, a step in fabricating an end-stressed transistor device is shown. The dummy gates 902 are etched away, leaving gaps 1102 over channel regions 1104 on the nanowires 802. The dummy gates 902 may be removed using any appropriate etch including, e.g., a wet chemical etch.

Figure 12:
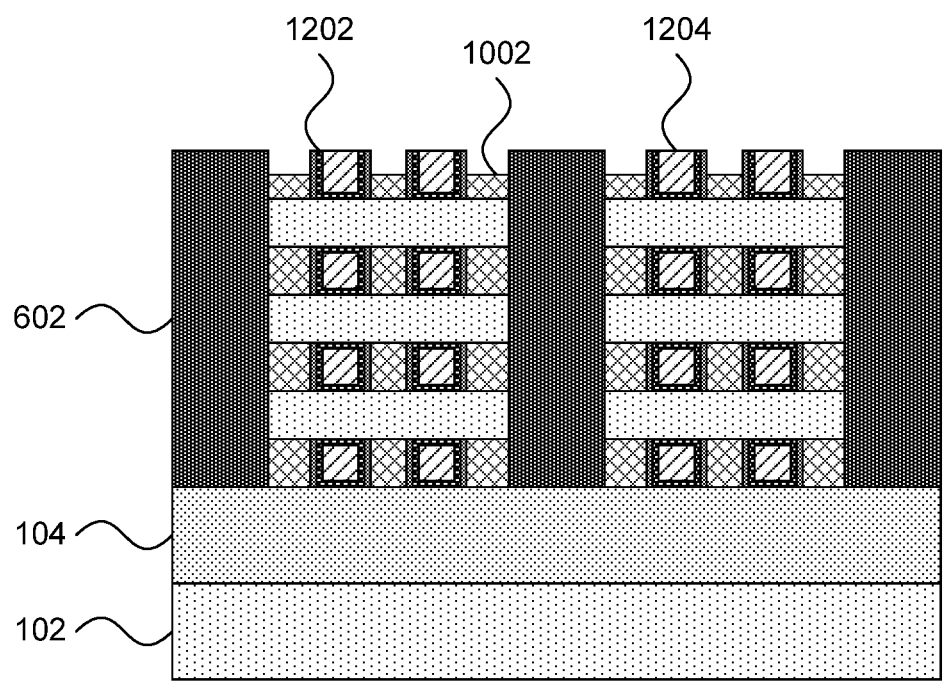
FIG. 12 is a cross-sectional diagram of a step in forming an integrated, strained, stacked nanowire FET in accordance with the present principles.

Referring now to FIG. 12, a step in fabricating an end-stressed transistor device is shown. The dummy gates 902 are replaced with a gate stack. A layer 1202 of gate dielectric material is conformally deposited in the gaps 1102, with the gate dielectric layer 1202 being formed on inner surfaces of the liner 904 and on the channel regions 1104 of nanowires 802 using, e.g., CVD. Gates 1204 are then deposited to fill the gaps 1102.

The gate dielectric layer 1202 may be formed from any appropriate insulating material, but it is specifically contemplated that the gate dielectric layer 1202 will be a high-k dielectric material. A high-k dielectric material is a material having a dielectric constant k that is higher than that of silicon dioxide. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum and aluminum.

The gates 1204 may be formed from any appropriate conductive material including, e.g., metals such as tungsten, nickel, titanium, molybdenum, tantalum, copper, platinum, silver, gold, ruthenium, iridium, rhenium, rhodium, and alloys thereof, polysilicon, or a conducting metallic compound material such as tantalum nitride, titanium nitride, tungsten silicide, tungsten nitride, ruthenium oxide, cobalt silicide, or nickel silicide. The conductive material may further include dopants that are incorporated during or after deposition. Contacts may be formed to provide electrical access to the gates 1204 and the source/drain regions 1002 for operation of the transistor.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 13:
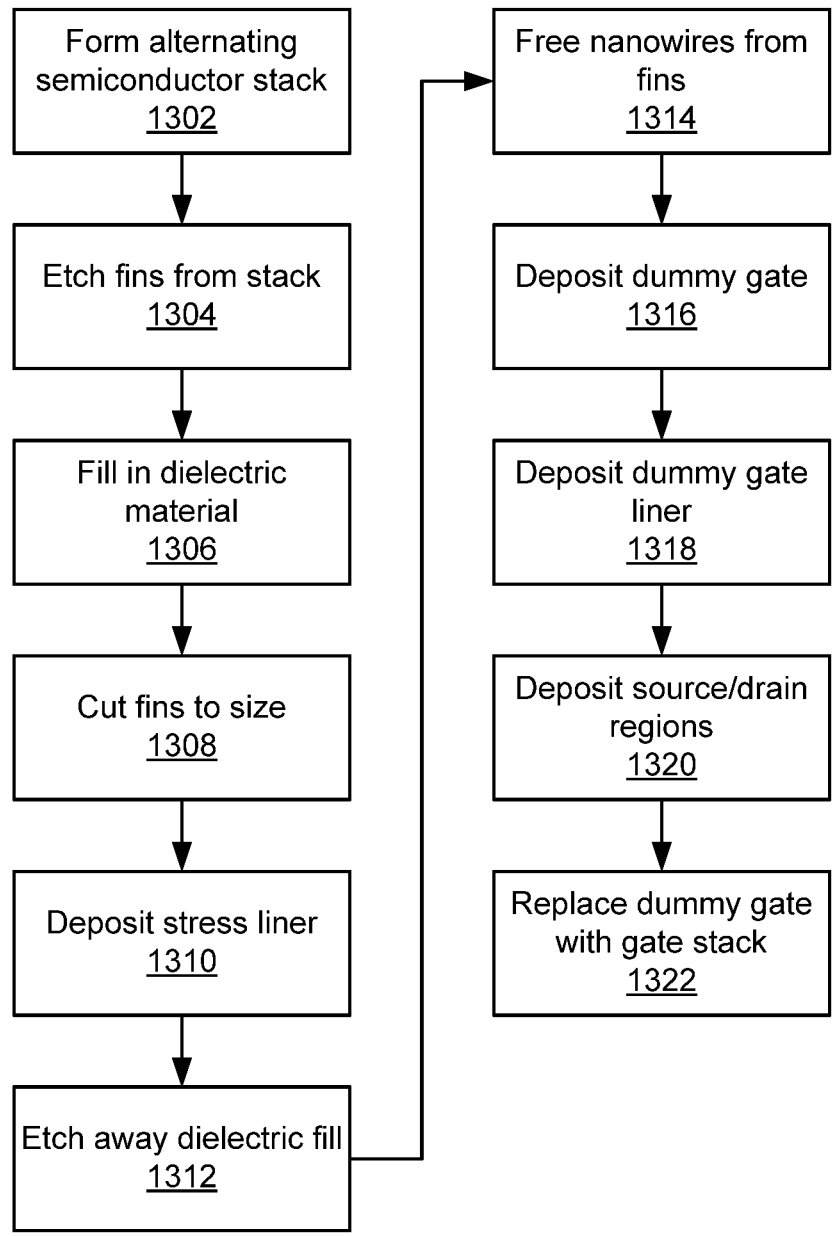
FIG. 13 is a block/flow diagram of a method of forming an integrated, strained, stacked nanowire FET in accordance with the present principles.

Referring now to FIG. 13, a method for fabricating an end-stressed transistor device is shown. Block 1302 forms a stack of alternating layers 107 and 108 of respective first and second semiconductor materials by, e.g., epixtaxially growing layers of silicon germanium and silicon. Block 1304 etches fins 204 out of the stack using hardmasks 202 and any appropriate lithographic process.

Block 1306 deposits a dielectric fill 402 to fill in the spaces between fins 204. Block 1306 may include any appropriate deposition process followed by polishing the dielectric material down to a top level of the hardmasks 202. Block 1308 then uses an anisotropic etch to cut the fins 204 to size, creating fins 502 and gap 504.

Block 1310 deposits a stress liner 602 on the ends of the fins 502. The stress liner 602 may be compressive or tensile, depending on whether the end device will be a p-type device or an n-type device and it is specifically contemplated that a silicon nitride liner material may be used.

Block 1312 etches away the dielectric fill 402 to expose the sides of the fins 502, leaving gaps 702. Block 1314 frees the nanowires 802 from the fins 502 by etching away the first semiconductor layers 107. Block 902 deposits dummy gate 902 over and around the nanowires 802, although it should be noted that, in an alternative embodiment, a gate stack may be deposited instead. Block 1318 deposits dummy gate liner 904 on the surfaces of the dummy gate 902.

Block 1320 deposits source/drain regions 1002 around the dummy gates 902. It is specifically contemplated that block 1320 grows the source/drain regions 1002 epitaxially and with in situ doping. Block 1322 then replaces the dummy gates 902 with a full gate stack, including gate dielectric layer 1202 and gates 1204.

Having described preferred embodiments of integrated strained stacked nanosheets FETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
   forming stress liners in contact with both ends of a fin of alternating channel material and sacrificial material layers, wherein the stress liners exert a stress on the fin;
   etching away the sacrificial material from the fin, such that the layers of the channel material are suspended from respective ends between the stress liners; and
   forming a gate stack on the suspended layers of channel material.

2. The method of claim 1, further comprising forming a dielectric fill around the fin before forming the stress liners.

3. The method of claim 1, further comprising etching away the dielectric fill after forming the stress liners.

4. The method of claim 1, wherein the channel material is silicon and wherein the sacrificial material is silicon germanium.

5. The method of claim 1, further comprising forming a dummy gate over and around the suspended layers of channel material.

6. The method of claim 1, wherein forming the gate stack comprises replacing the dummy gate with the gate stack.

7. The method of claim 1, wherein the layers of channel material are nanowires.

8. The method of claim 1, wherein the layers of channel material are nanosheets.

9. The method of claim 1, wherein the stress liners comprise silicon nitride.

10. A method for forming a semiconductor device, comprising:
    forming a dielectric fill around a fin of alternating channel material and sacrificial material layers;
    forming stress liners in contact with both ends of the fin after forming the dielectric fill, wherein the stress liners exert a stress on the fin;
    etching away the sacrificial material from the fin, such that the layers of the channel material are suspended between the stress liners; and
    forming a gate stack on the suspended layers of channel material.

11. The method of claim 10, further comprising etching away the dielectric fill after forming the stress liners.

12. The method of claim 10, wherein the channel material is silicon and wherein the sacrificial material is silicon germanium.

13. The method of claim 10, further comprising forming a dummy gate over and around the suspended layers of channel material.

14. The method of claim 13, wherein forming the gate stack comprises replacing the dummy gate with the gate stack.

15. The method of claim 10, wherein the layers of channel material are nanowires.

16. The method of claim 10, wherein the layers of channel material are nanosheets.

17. The method of claim 10, wherein the stress liners comprise silicon nitride.

* * * * *